United States Patent
Zhao

(10) Patent No.: US 11,427,925 B2
(45) Date of Patent: Aug. 30, 2022

(54) APPARATUS AND METHOD FOR INGOT GROWTH

(71) Applicant: Zing Semiconductor Corporation, Shanghai (CN)

(72) Inventor: Xuliang Zhao, Shanghai (CN)

(73) Assignee: Zing Semiconductor Corporation, Shanghai (CN)

( * ) Notice: Subject to any disclaimer, the term of this patent is extended or adjusted under 35 U.S.C. 154(b) by 71 days.

(21) Appl. No.: 16/952,564

(22) Filed: Nov. 19, 2020

(65) Prior Publication Data
US 2022/0010454 A1  Jan. 13, 2022

(30) Foreign Application Priority Data
Jul. 7, 2020 (CN) .......................... 202010647709.6

(51) Int. Cl.
*C30B 15/30* (2006.01)
*C30B 15/14* (2006.01)
*C30B 15/20* (2006.01)
*C30B 29/06* (2006.01)

(52) U.S. Cl.
CPC .............. *C30B 15/30* (2013.01); *C30B 15/14* (2013.01); *C30B 15/20* (2013.01); *C30B 29/06* (2013.01)

(58) Field of Classification Search
CPC ......... C30B 15/14; C30B 15/20; C30B 15/30; C30B 29/06
See application file for complete search history.

(56) References Cited

U.S. PATENT DOCUMENTS

| 4,686,091 A * | 8/1987 | Washizuka | C30B 15/14 117/953 |
| 2017/0167048 A1 * | 6/2017 | Kim | C30B 15/00 |

* cited by examiner

*Primary Examiner* — Matthew J Song
(74) *Attorney, Agent, or Firm* — Chen Yoshimura LLP

(57) ABSTRACT

The present application provides an apparatus and a method for ingot growth. The apparatus for ingot growth comprises a growth furnace, a crucible, a heater, a lifting mechanism, an infrared detector, a dividing disc, a sensor and a control device. The crucible is located within the growth furnace. The lifting mechanism comprises a lifting wire and a driving device, wherein the lifting wire connects to the top of the ingot via one terminal and to the driving device via another terminal. The bottom of the ingot puts inside the crucible, and the ingot has plural crystal lines thereon. The infrared detector is located outside the growth furnace. The dividing disc is above the growth furnace, connects to the lifting mechanism, and rotates with the ingot synchronously under the driving of the lifting mechanism, and an orthographic projection of bisector of the dividing disc is between two adjacent crystal lines. The sensor is located on the periphery of the dividing disc. The control device connects to the infrared detector and the sensor in order to control the infrared detector to detect the ingot diameter while the sensor senses the bisector of the dividing disc. The present application is able to increase ingot quality and enhance product yield.

9 Claims, 1 Drawing Sheet

APPARATUS AND METHOD FOR INGOT GROWTH

BACKGROUND OF THE INVENTION

1. Field of the Invention

The present application relates to a technical field of ingot growth, in particular to an apparatus and a method for ingot growth.

2. Description of the Related Art

Czochralski method (CZ method) is a conventional method for ingot growth, and generally comprises the steps of feeding materials, melting, seeding, necking, crowning, shouldering, growing body, and tailing. For example, raw materials such as silicon briquettes are fed into a crucible and heated to melt completely. At the same time, gas flow, pressure, crucible location, ingot rotation and crucible rotation are adjusted according to process requirements. While the status of the melt is stable, a crystal seed is lowered to close to the melt surface with a spacing of 3-5 mm, and is preheated. The crystal seed is lowered to the melt surface to fully contact, then it is inserted into the melt to conduct the necking step. After the necking step, the diameter of the ingot increases to a predetermined diameter. While the neck is long enough and the certain pulling rate is achieved, the pulling rate can be reduced to conduct the crowning step and the shouldering step. Then it enters the steps of body growth and tailing to complete the ingot growth. During the process, the ingot diameter should be monitored carefully to ensure the final product of the ingot meeting the requirements. Conventionally, several methods can be applied to monitor the ingot diameter. One is IRcon method, which senses the temperature change by using infrared to convert to the ingot diameter. IRcon method is easy to apply because of single point measurement, however, it is largely affected by crystal lines of the ingot and deflection of ingot rotation. If the IRcon sensor senses the crystal line, the detected data has large deviation. Further, sway cannot be avoided during the ingot rotation, but the IRcon sensor is unable to conduct motion capture to the sense point. Under these circumstances, the detected data has significantly large deviation, causing the produced ingot failing to meet the desired requirements and huge economic damages.

SUMMARY

The present application provides an apparatus and a method for ingot growth to solve the above conventional technical problems such as significantly large deviation of the detected data. It is because the IRcon sensor easily senses the crystal line, and/or the IRcon sensor is unable to conduct motion capture to the sense point but the ingot rotation causes a certain amount of sway. It causes the produced ingot failing to meet the desired requirements and makes huge economic damages.

For the above and the relevant purposes, the present application provides an apparatus for ingot growth comprises a growth furnace, a crucible, a heater, a lifting mechanism, an infrared detector, a dividing disc, a sensor and a control device. The growth furnace has a detecting window on upper part of the furnace. The crucible is located within the growth furnace and containing a raw material for ingot growth. The heater is located within the growth furnace and outside the crucible and heating the raw material. The lifting mechanism comprises a lifting wire and a driving device, wherein the lifting wire connects to the top of the ingot via one terminal and to the driving device via another terminal, and the bottom of the ingot puts inside the crucible, and the ingot has plural crystal lines extending longitudinally thereon. The infrared detector is located outside the growth furnace, wherein the infrared detector produces a detecting signal passing through the detecting window to the ingot surface to detect the ingot diameter. The dividing disc is located above the growth furnace and connects to the lifting mechanism, and synchronously rotates with the ingot under the driving of the lifting mechanism. The orthographic projection of bisector of the dividing disc is between two adjacent crystal lines. The sensor is located on the periphery of the dividing disc and has an interval with the dividing disc, wherein the sensor detects the bisector of the dividing disc. The control device connects to the infrared detector and the sensor, and controls the infrared detector to detect the ingot diameter while the sensor senses the bisector of the dividing disc.

DETAILED DESCRIPTION OF THE EMBODIMENTS

Figure 1:
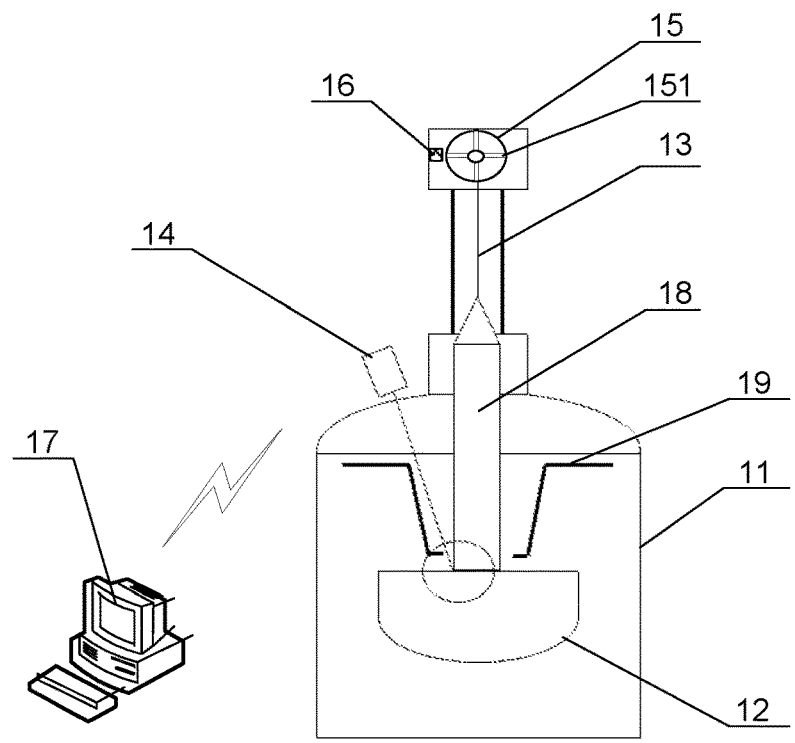
FIG. 1 illustrates the structure of the apparatus of the present application.

For the above and the relevant purposes, the present application provides an apparatus for ingot growth comprises a growth furnace, a crucible, a heater, a lifting mechanism, an infrared detector, a dividing disc, a sensor and a control device. The growth furnace has a detecting window on upper part of the furnace. The crucible is located within the growth furnace and containing a raw material for ingot growth. The heater is located within the growth furnace and outside the crucible and heating the raw material. The lifting mechanism comprises a lifting wire and a driving device, wherein the lifting wire connects to the top of the ingot via one terminal and to the driving device via another terminal, and the bottom of the ingot puts inside the crucible, and the ingot has plural crystal lines extending longitudinally thereon. The infrared detector is located outside the growth furnace, wherein the infrared detector produces a detecting signal passing through the detecting window to the ingot surface to detect the ingot diameter. The dividing disc is located above the growth furnace and connects to the lifting mechanism, and synchronously rotates with the ingot under the driving of the lifting mechanism. The orthographic projection of bisector of the dividing disc is between two adjacent crystal lines. The sensor is located on the periphery of the dividing disc and has an interval with the dividing disc, wherein the sensor detects the bisector of the dividing disc. The control device connects to the infrared detector and the sensor, and controls the infrared detector to detect the ingot diameter while the sensor senses the bisector of the dividing disc.

In one embodiment, the ingot has four crystal lines. The four crystal lines distribute on the periphery, and have a same interval between each other. The dividing disc is a quarter-type dividing disc.

In one embodiment, a distance between any point on the bisector of the dividing disc and one crystal line is identical to that between the point and the adjacent crystal line.

In one embodiment, the control device comprises a storage unit for storing the data detected by the infrared detector.

In one embodiment, the apparatus for ingot growth further comprises a heat shield located within the furnace, surrounding the ingot, and extending toward the inner wall of the furnace.

In one embodiment, the control device comprises computer, micro controller unit (MCU) and programmable logic controller (PLC) or any combination thereof.

In one embodiment, the orthographic projection of the dividing disc covers the ingot.

In one embodiment, the sensor comprises contact sensor, photoelectric sensor, or a combination thereof.

In one embodiment, the ingot axis coincides with the centerline of the diving disc.

The present application also provides a method for ingot growth comprising conducting the ingot growth by using any apparatus as described above.

In the present application, the improved design for the structures of the apparatus can avoid the deviation of the detected data caused by the sensing of crystal line by the sensor of the infrared detector. Accordingly, the accuracy of determination for the ingot diameter can be increased, the ingot quality and the yield can be enhanced.

EXAMPLES

The present application can be described by the following embodiments. A person having ordinary skills in the art is able to easily understand other advantages and effects of the present application based on the disclosure of the present specification. The present application may be practiced or applied in different forms. Further, based on different practices or applications, each element, component or other details can be modified or changed without departure from the disclosure.

Figure 2:
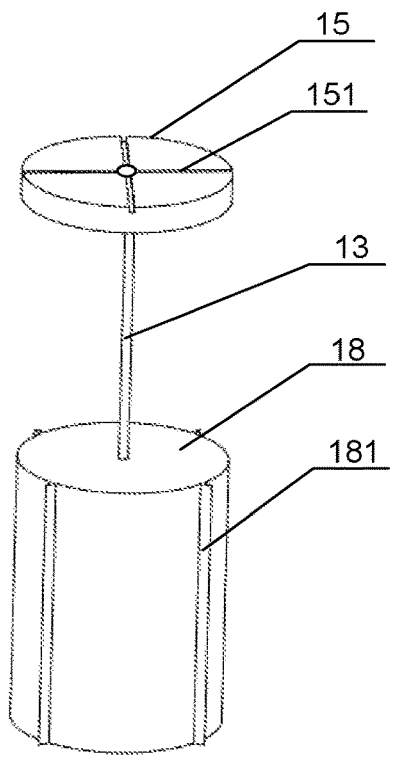
FIG. 2 illustrates the relationship of locations between the ingot and the diving disc of the apparatus of the present application.

Please refer FIG. 1 and FIG. 2. It should be understood that the drawing is merely for the purpose of illustration for basic concepts of the present application, so that only the components relevant to the present application is shown. The drawing(s) may not show the real number, shape and size of the components. In practice, any desired change for the type, number and ratio of the components can be made, and the arrangement of the components may be more complex.

Referring FIG. 1 and FIG. 2, the present application provides an apparatus for ingot growth comprises a growth furnace 11, a crucible 12, a heater, a lifting mechanism, an infrared detector 14, a dividing disc 15, a sensor 16 and a control device 17. The growth furnace 11 has a detecting window on upper part of the furnace. The crucible 12 is located within the growth furnace 11 and containing a raw material for the growth of ingot 18, such as silicon briquettes. The heater is located within the growth furnace 11 and outside the crucible 12, and heats the raw material contained in the crucible 12 during the growing process of the ingot 18 to melt the raw material as liquid state. The lifting mechanism comprises a lifting wire 13 and a driving device. The lifting wire 13 comprises, but not include, tungsten wire. The lifting wire 13 connects to the top of the ingot 18 via one terminal and to the driving device (not shown in figure) via another terminal. Namely, one terminal of the lifting wire 13 extends to the growth furnace 11, and another terminal of the lifting wire 13 passes through the cover on the top of the growth furnace 11 and connects to the driving device. The bottom of the ingot 18 puts inside the crucible 12, and the ingot 18 has plural crystal lines 181 extending longitudinally thereon. The infrared detector 14 is located outside the growth furnace. The infrared detector 14 produces a detecting signal passing through the detecting window to the surface of the ingot 18 to detect the ingot diameter. The dividing disc 15 is located above the growth furnace 11 (generally located above the outside of the growth furnace 11) and connects to the lifting mechanism, and synchronously rotates with the ingot 18 under the driving of the lifting mechanism. The orthographic projection of bisector 151 of the dividing disc 15 is between two adjacent crystal lines 181. Namely, the line of the orthographic projection of bisector 151 of the dividing disc 15 does not cross with any crystal line 181. The sensor 16 is located on the periphery of the dividing disc 15 and has an interval with the dividing disc 15. The sensor 16 detects the bisector 151 of the dividing disc 15. The control device 17 connects to the infrared detector 14 and the sensor 16, and controls the infrared detector 17 to detect the diameter of the ingot 18 while the sensor 16 senses the bisector 151 of the dividing disc 15. During the growth of the ingot 18, the melted raw materials (i.e. the melt) contacts with the bottom of the ingot 18 (i.e. the seed at the initial growth stage of the ingot 18). The ingot 18 is drawn by the lifting wire 13 to rotate and elevate for the growth. During the process, the dividing disc 15 synchronously rotates with the ingot 18 under the driving of the lifting mechanism. While the sensor 16 senses the bisector 151 of the dividing disc 15, the control device is triggered to produce a signal to the infrared detector to detect the diameter of the ingot 18. Because the bisector 151 of the dividing disc 15 does not cross with any crystal line 181 of the ingot 18 and the dividing disc 15 synchronously rotates with the ingot 18, at the time the sensor 16 sensing the bisector 151 of the dividing disc 15, the detection signal of the infrared detector 14 does not touch the crystal line 181 of the ingot 18. It should be noted that, at the initial installation of the infrared detector 14, its irradiation point of the detection signal has to be set at non-crystal line position of the ingot 18, preferably at a position in middle of two adjacent crystal lines 181 and near the liquid surface of the melt. Accordingly, the deviation of the detected data caused by the sensing of crystal line 181 of the ingot 18 by the sensor of the infrared detector 14 can be significantly avoided. Accordingly, the accuracy of determination for the ingot 18 diameter can be increased, and the yield can be enhanced.

In one embodiment, the number of the bisector 151 of the dividing disc 15 is preferably identical to the number of the crystal lines 181 of the ingot 18. As shown in FIG. 2, in one embodiment, the ingot 18 has four crystal lines. The four crystal lines 181 evenly distribute on the periphery of the ingot 18. The crystal lines 181 extend on the ingot 18 longitudinally and grow with the ingot 18 synchronously. Orientation of single crystal can be determined based on the crystal lines 181. Correspondingly, the dividing disc is preferably a quarter-type dividing disc. It means that the dividing disc 15 is divided into four areas with same shape and same size by the four bisectors 151, for example, the dividing disc 15 as a round plate is quartered to four identical sectors. The four bisectors 151 come from the center of the dividing disc 15 to the periphery to form the four bisector points. While the sensor 16 senses the bisector point, it substantially detect the bisector. It should be noted that, the top of the ingot 18 is the seed, i.e. the non-equant part, which is not shown in this embodiment. In other embodiments, the ingot 18 may have three crystal lines and the dividing disc is a third-type dividing disc. In some embodiments, the number of the bisector of the dividing disc is different from the number of the crystal lines of the ingot. It is important to ensure the orthographic projection of bisector 151 of the dividing disc 15 being between two adjacent crystal lines 181 of the ingot 18, namely, the line of the orthographic projection of the bisector 151 of the dividing disc 15 does not cross with any crystal line 181 of the ingot 18. In this embodiment, it is preferably that the number of the bisector of the dividing disc is identical to that of the crystal line.

The infrared detector 14 (IRcon) is a device for detection of ingot diameter based on the principle of temperature detection by infrared. Since it is well known by a person having ordinary skills in the art, the infrared detector is not described herein.

In one embodiment, a distance between any point on the bisector 151 of to the dividing disc 15 and one crystal line 181 is identical to that between the point and the adjacent crystal line 181. To avoid the disturbance of rotation and elevation of the ingot 18, the dividing disc 15 locates above the ingot 18 and has a certain distance with the ingot 18. Therefore, the bisector 151 of the dividing disc 15 and the crystal lines 181 of the ingot 18 are not on the same plane and do not cross substantially. The term "a distance between any point on the bisector 151 of the dividing disc 15 and one crystal line 181 is identical to that between the point and the adjacent crystal line 181" described herein can also described as a distance between any point on extension line of the orthographic projection of the bisector 151 of the dividing disc 15 and one crystal line 181 is identical to that between the point and the adjacent crystal line 181. Namely, the point locates at the middle of the arc of the ingot 18 between the adjacent two crystal lines 181, or, the line of the orthographic projection of the bisector 151 of the dividing disc 15 overlaps with the bisector of the arc between the adjacent two crystal lines 181. By this arrangement, even the signal transmission from the sensor 16 sensing the bisector 151 of the dividing disc 15 slightly delays to the control device 17 to trigger the control instruction, it can effectively prevent the infrared detector 14 from detecting the crystal lines 181.

In one embodiment, the orthographic projection of the dividing disc 15 covers the ingot 18, meaning that, the dividing disc 15 has a surface area larger than or equal to the longitudinal surface area of the ingot 18. Preferably, the surface area of the dividing disc 15 is equal to the longitudinal surface area of the ingot 18, which does not contain the areas of the crystal lines 181 and the seeding area. Further, the axis of the ingot 18 coincides with the centerline of the diving disc 15. To facilitate the detection accuracy, the lifting wire passes through the center of the diving disc 15 to ensure completely synchronous rotation between the diving disc 15 and the ingot 18.

In one embodiment, the apparatus for ingot growth further comprises a heat shield 19 located within the furnace 11, surrounding the ingot 18, and extending toward the inner wall of the furnace 11. The heat shield 19 is able to change the distribution of heat field of the furnace 11 to effectively adjust the temperature gradient for growing the ingot 18.

In one embodiment, the apparatus for ingot growth further comprises an inert gas supplying device (not shown in drawings). The inert gas supplying device connects with an inert gas source to supply the inert gas, such as argon, into the furnace 11. The inert atmosphere within the furnace 11 is maintained to avoid contamination of the raw materials and the ingot 18. An exhaust vent is set in the bottom of the furnace 11 to maintain a dynamic balance of the inert atmosphere within the furnace.

In one embodiment, the control device 17 comprises a storage unit for storing the data detected by the infrared detector 14. In one embodiment, the control device 17 is able to calculate to obtain an average value while the data at four points on the periphery of the ingot 18 on a same horizontal plane is detected by the infrared detector 14. In one embodiment, the control device 17 is able to calculate to obtain an average value based on the collected data during a time period. Accordingly, the insufficient single-point detection by using the conventional IRcon can be improved, and the detection accuracy can be increased. The apparatus for ingot growth further comprises a display connecting with the control device 17 to show the real-time detection result of the infrared detector 14.

In one embodiment, the control device 17 comprises computer, microcontroller unit (MCU) and programmable logic controller (PLC) or any combination thereof. If the control device 17 is PLC, the PLC can be integrated into the master controller of the apparatus. In the other words, the master controller of the apparatus integrates functions of the PLC. Further, the control device 17 connects to the driving device of the lifting mechanism to control the lifting rate, and connects to the heater to control the heating temperature. In one embodiment, the control device 17 connects to the infrared detector 14, the sensor 16, the heater and the lifting mechanism simultaneously. Accordingly, based on the diameter of the ingot 18 detected by the infrared detector 14, the control device 17 adjusts the heating temperature of the heater and/or the lifting rate of the lifting mechanism for further adjusting the growth of the diameter of the ingot 18.

In one embodiment, the ingot 18 includes but is not limited by, the ingot of single crystal silicon, and correspondingly, the raw material includes but is not limited by silicon briquettes.

In one embodiment, the sensor 16 comprises contact sensor, photoelectric sensor, or a combination thereof. The sensor 16 can be a single sensor or plural sensors. If the plural sensors 16 are applied, the sensors 16 can be same or different types. In this embodiment, the sensor 16 is a single sensor, in order to simplify the apparatus structure and reduce the data interference.

The application principle of the apparatus for ingot growth is described as follows. During the process, the lifting mechanism rotates and lifts the ingot 18 from the melt within the crucible 12 to conduct the ingot growth, and drives the diving disc 15 to synchronously rotate with the ingot 18. At the moment the sensor 16 senses a bisector 151 of the dividing disc 15, the control device 17 triggers the infrared detector 14 to detect the diameter of the ingot 18. Since the orthographic projection of the bisector 151 of the dividing disc 15 and the crystal lines 181 of the ingot 18 do not cross, the infrared detector 14 does not sense the crystal lines 181, and, accordingly, it effectively avoid the detection error caused by the infrared detector 14 sensing the crystal lines 181. Thereby, it increases the accuracy for the diameter detection of the ingot 18, significantly enhances the ingot quality, and increase the yield.

The present application further provides a method for ingot growth, which is based on any apparatus described as any of the above solutions. In embodiments of the method, based on the arrangement of the diving disc and the infrared detector, the diameter of the ingot is detected by the infrared detector only while the sensor senses the bisector of the dividing disc. Further, an average value can be obtained based on the data of each periphery detection of the ingot. Preferably, the number of detection data is identical to the number of crystal lines. It increases the accuracy for the diameter detection of the ingot, and significantly enhances the ingot quality.

According to the above, the present application provides an apparatus and a method for ingot growth. The apparatus for ingot growth comprises a growth furnace, a crucible, a heater, a lifting mechanism, an infrared detector, a dividing disc, a sensor and a control device. The growth furnace has a detecting window on upper part of the furnace. The crucible is located within the growth furnace and contains a raw material for ingot growth. The heater is located within the growth furnace and outside the crucible, and heats the raw material. The lifting mechanism comprises a lifting wire and a driving device, wherein the lifting wire connects to the top of the ingot via one terminal and to the driving device via another terminal. The bottom of the ingot puts inside the crucible, and the ingot has plural crystal lines extending longitudinally thereon. The infrared detector is located outside the growth furnace, wherein the infrared detector produces a detecting signal passing through the detecting window to the ingot surface to detect the ingot diameter. The dividing disc is located above the growth furnace, connects to the lifting mechanism, and synchronously rotates with the ingot under the driving of the lifting mechanism. The orthographic projection of bisector of the dividing disc is between two adjacent crystal lines. The sensor is located on the periphery of the dividing disc and has an interval with the dividing disc, wherein the sensor detects the bisector of the dividing disc. The control device connects to the infrared detector and the sensor, and controls the infrared detector to detect the ingot diameter while the sensor senses the bisector of the dividing disc. In the present application, the improved design for the structures of the apparatus can avoid the deviation of the detected data caused by the sensing of crystal line by the sensor of the infrared detector, and, accordingly, increases the accuracy of determination for the ingot diameter and enhances the ingot quality and the yield.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure. The scope of the present invention is defined by the appended claims and their equivalent scope.

What is claimed is:

1. An apparatus for ingot growth comprising:
a growth furnace having a detecting window on upper part of the furnace;
a crucible located within the growth furnace and containing a raw material for ingot growth;
a heater located within the growth furnace and outside the crucible and heating the raw material;
a lifting mechanism comprising a lifting wire and a driving device, wherein the lifting wire connects to the top of the ingot via one terminal and to the driving device via another terminal, and the bottom of the ingot puts inside the crucible, and the ingot has plural crystal lines extending longitudinally thereon;
an infrared detector located outside the growth furnace, wherein the infrared detector produces a detecting signal passing through the detecting window to the ingot surface to detect the ingot diameter;
a dividing disc located above the growth furnace, connecting to the lifting mechanism, and synchronously rotating with the ingot under the driving of the lifting mechanism, and an orthographic projection of bisector of the dividing disc being between two adjacent crystal lines;
a sensor located on the periphery of the dividing disc and having an interval with the dividing disc, wherein the sensor detects the bisector of the dividing disc;
a control device connecting to the infrared detector and the sensor, and controlling the infrared detector to detect the ingot diameter while the sensor senses the bisector of the dividing disc.

2. The apparatus of claim 1, wherein the ingot has four crystal lines distributed on the periphery and having a same interval between each other, and the dividing disc is a quarter-type dividing disc.

3. The apparatus of claim 1, wherein a distance between any point on the bisector of the dividing disc and one crystal line is identical to that between the point and the adjacent crystal line.

4. The apparatus of claim 1, wherein the control device comprises a storage unit for storing the data detected by the infrared detector.

5. The apparatus of claim 1, further comprising a heat shield located within the furnace, surrounding the ingot, and extending toward the inner wall of the furnace.

6. The apparatus of claim 1, wherein the control device comprises computer, microcontroller unit (MCU) and programmable logic controller (PLC) or any combination thereof.

7. The apparatus of claim 1, wherein the orthographic projection of the dividing disc covers the ingot.

8. The apparatus of claim 1, wherein the sensor comprises contact sensor, photoelectric sensor, or a combination thereof.

9. The apparatus of claim 1, wherein the ingot axis coincides with the centerline of the diving disc.

* * * * *